(12) United States Patent
Fischer et al.

(10) Patent No.: US 8,381,141 B2
(45) Date of Patent: Feb. 19, 2013

(54) METHOD AND SYSTEM FOR COMPARING LITHOGRAPHIC PROCESSING CONDITIONS AND OR DATA PREPARATION PROCESSES

(75) Inventors: Stephen E. Fischer, Wappingers Falls, NY (US); James A. Culp, Newburgh, NY (US); Robert T. Sayah, Verbank, NY (US)

(73) Assignee: International Business Machines Corporation, Armonk, NY (US)

( * ) Notice: Subject to any disclaimer, the term of this patent is extended or adjusted under 35 U.S.C. 154(b) by 295 days.

(21) Appl. No.: 12/914,212

(22) Filed: Oct. 28, 2010

(65) Prior Publication Data

US 2012/0107969 A1 May 3, 2012

(51) Int. Cl.
*G06F 17/50* (2006.01)
(52) U.S. Cl. .......................................... 716/53; 716/52
(58) Field of Classification Search .................. None
See application file for complete search history.

(56) References Cited

U.S. PATENT DOCUMENTS

| | | | |
|---|---|---|---|
| 6,978,438 B1 * | 12/2005 | Capodieci | 716/53 |
| 7,076,749 B2 | 7/2006 | Kemerer et al. | |
| 7,269,804 B2 | 9/2007 | Tabery et al. | |
| 7,281,222 B1 | 10/2007 | Babcock | |
| 7,305,334 B2 | 12/2007 | Graur et al. | |
| 7,313,769 B1 * | 12/2007 | Lukanc et al. | 716/52 |
| 7,434,195 B2 | 10/2008 | Hsu et al. | |
| 7,434,198 B2 * | 10/2008 | Strelkova et al. | 716/53 |
| 7,607,114 B2 * | 10/2009 | Mansfield et al. | 716/53 |
| 7,657,864 B2 | 2/2010 | Tabery et al. | |
| 7,685,558 B2 | 3/2010 | Lai et al. | |
| 7,765,518 B2 * | 7/2010 | De La Cruz et al. | 716/50 |
| 8,108,804 B2 * | 1/2012 | Graur et al. | 716/52 |
| 8,161,423 B1 * | 4/2012 | Joshi | 716/53 |
| 8,185,847 B2 * | 5/2012 | Robles et al. | 716/50 |
| 2005/0251771 A1 * | 11/2005 | Robles | 716/5 |
| 2009/0241085 A1 | 9/2009 | De La Cruz et al. | |
| 2010/0131909 A1 | 5/2010 | Miloslavsky et al. | |
| 2010/0333049 A1 * | 12/2010 | Agarwal et al. | 716/55 |

* cited by examiner

*Primary Examiner* — Leigh Garbowski
(74) *Attorney, Agent, or Firm* — Scully, Scott, Murphy & Presser, P.C.; Wenjie Li

(57) ABSTRACT

A set of optical rule checker (ORC) markers are identified in a simulated lithographic pattern generated for a set of data preparation parameters and lithographic processing conditions. Each ORC marker identifies a feature in the simulated lithographic pattern that violates rules of the ORC. A centerline is defined in each ORC marker, and a minimum dimension region is generated around each centerline with a minimum width that complies with the rules of the ORC. A failure region is defined around each ORC marker by removing regions that overlap with the ORC marker from the minimum dimension region. The areas of all failure regions are added to define a figure of demerit, which characterizes the simulated lithographic pattern. The figure of demerit can be evaluated for multiple simulated lithographic patterns or iteratively decreased by modifying the set of data preparation parameters and lithographic processing conditions.

20 Claims, 12 Drawing Sheets

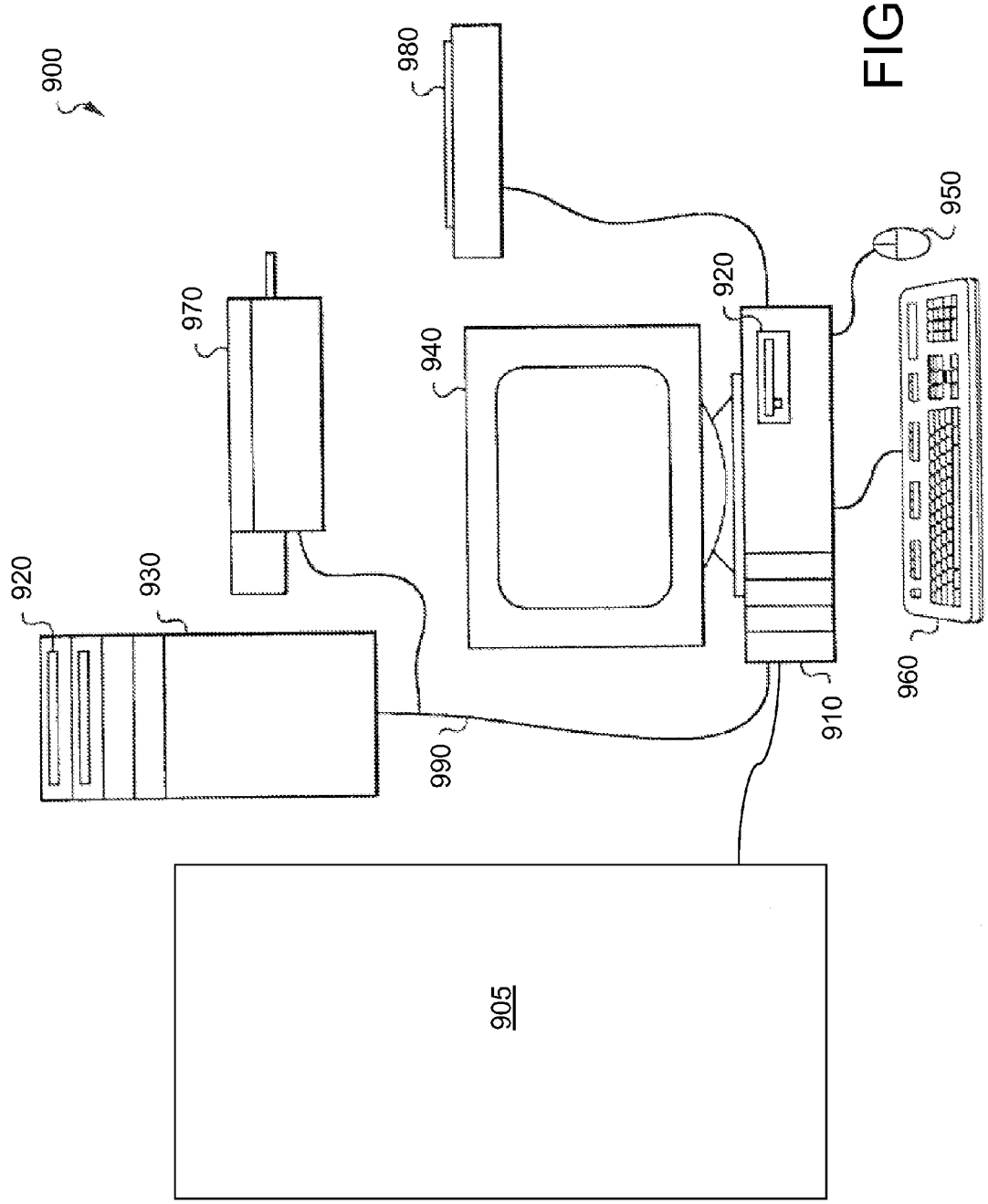

METHOD AND SYSTEM FOR COMPARING LITHOGRAPHIC PROCESSING CONDITIONS AND OR DATA PREPARATION PROCESSES

BACKGROUND

The present disclosure relates to a method and system for evaluating parameters employed for manufacturing semiconductor structures, and particularly to a method for comparing and/or selecting a set of lithographic processing conditions and/or data preparation processes for printing a lithographic pattern, a system for performing the same, and a non-transitory machine-readable data storage device embodying a program for performing the same.

Lithographic capabilities are one of the significant technological limitations that constrain the continued scaling of semiconductor devices. In order to manufacture high performance semiconductor devices at a high yield, a lithographic pattern must be printed without triggering functional failures in semiconductor devices while providing minimum lithographic dimensions where necessary.

The complexity in interference patterns during lithographic printing can be simulated for a given set of lithographic processing conditions and a given lithographic mask. Further, the pattern in a lithographic mask can be adjusted by setting data preparation parameters during data preparation. Thus, simulation of a physical lithographic pattern is possible even before manufacturing a lithographic mask by providing data preparation parameters to be employed to manufacture a lithographic mask and a set of lithographic processing conditions on the lithographic mask to be employed at the lithographic processing step, e.g., parameters relating to the photoresist to be employed and lithographic exposure conditions to be employed.

A simulated lithographic pattern can be checked to determine whether any feature size therein is too small for achieving a reasonable level of yield during manufacturing of corresponding semiconductor devices. A program that encodes rules for ideal simulated lithographic patterns is referred to as an "optical rule checker," i.e., an "ORC." An ORC can be run to identify regions of a simulated lithographic pattern generated under the assumption of a selected set of lithographic processing conditions and a selected set of data preparation conditions, or under the assumption of a selected set of lithographic processing conditions and a particular lithographic mask manufactured employing a selected set of data preparation conditions. A violation of the ORC rule can occur either by a pattern that produces a line width (i.e., a width of a region of a photoresist as simulated) that is less than a minimum line width or a pattern that produces a spacing (i.e., a distance between two adjacent photoresist portions as simulated) that is less than a minimum spacing.

Two prior art methods are known for evaluation of lithographic processing conditions and data preparation parameters employing an ORC. A first method is manual observation and comparison of regions that violate rules of the ORC. This method tends to require excessive time and effort for a complex lithographic pattern that is typically present in large scale integrated semiconductor devices.

A second method is an automated categorized counting of features in the simulated lithographic pattern. In the second method, the degree of failure under the ORC rules is categorized according to the degree of failure. For example, a feature that provides a minimum width of 25 nm and a feature that provides a minimum width of 30 nm where the ORC rules require a minimum width of 32 nm can be classified as failures of two different degrees, in which one feature fails by 7 nm and another feature fails by 2 nm. The different degrees of failure can be characterized by a histogram including multiple failure "buckets," in which each bucket represents a non-overlapping range of deviations from the minimum width required under the ORC rules. In the example illustrated above, the feature that fails by 7 nm increases a failure count in a failure bucket that includes 7 nm in the range, and the feature that fails by 2 nm by a failure count in a failure bucket that includes 2 nm in the range. In general, the second method provides a histogram of a predefined failure buckets for each combination of data preparation parameters and lithographic processing conditions.

While the second method provides an automated method of comparing data preparation parameters and/or lithographic processing conditions that can be employed for a lithographic pattern, comparison of data preparation parameters and/or lithographic processing conditions employing the second method is difficult because one histogram must be compared with another histogram. Histograms can be difficult to compare in selecting an optimal set of data preparation parameters and/or an optimal set of lithographic processing conditions because multiple parameters, i.e., the counts in each bucket, are involved in the comparison.

Furthermore, methods of counting discrete errors cannot be used in combination with certain forms of automated optimization algorithms, which are desirable as a means of automatically computing optimum lithography or data preparation parameters. For example, Levenberg-Marquardt optimization requires a continuous error measure in order to function properly, and as such, cannot effectively employ data in the form of a histogram for optimization purposes.

BRIEF SUMMARY

In the present disclosure, a set of optical rule checker (ORC) markers are identified in a simulated lithographic pattern generated for a set of data preparation parameters and lithographic processing conditions. Each ORC marker identifies a feature in the simulated lithographic pattern that violates rules of the ORC. A centerline is defined in each ORC marker, and a minimum dimension region is generated around each centerline with a minimum width that complies with the rules of the ORC. A failure region is defined around each ORC marker by removing regions that overlap with the ORC marker from the minimum dimension region. The areas of all failure regions are added to define a figure of demerit, which characterizes the simulated lithographic pattern. The figure of demerit can be evaluated for multiple simulated lithographic patterns to select an optimal set of data preparation parameters and lithographic processing conditions, or a set of data preparation parameters and lithographic processing conditions can be modified until the figure of demerit decreases below a predefined threshold.

According to an aspect of the present disclosure, a method of printing a lithographic pattern on a substrate is provided. The method includes: providing at least one simulated lithographic pattern, wherein each of the at least one simulated lithographic pattern is generated employing a set of lithographic processing conditions and data preparation parameters; identifying a set of optical rule checker (ORC) markers in each of the at least one simulated lithographic pattern, wherein each of the ORC markers includes a region of the at least one simulated lithographic pattern that includes a dimension less than a minimum dimension in rule of an optical rule checker; generating a minimum dimension region around each of the set of ORC markers, wherein each minimum dimension region has the minimum dimension throughout an entirety of a length thereof; generating a failure region around each of the set of ORC markers by subtracting areas of line patterns or space patterns from each of the minimum dimension regions; generating a figure of demerit by adding all areas of the failure regions for each of the at least one simulated lithographic pattern; and printing a lithographic pattern on a substrate employing one of the at least one simulated lithographic pattern by selecting a simulated lithographic pattern having a least figure of demerit among the generated at least one figure of demerit or after verifying that a figure of demerit of a selected simulated lithographic pattern is less than a predefined criterion.

According to another aspect of the present disclosure, a system for printing a lithographic pattern on a substrate includes a computing means and a lithography apparatus. The computing means is configured to perform the steps of: identifying a set of optical rule checker (ORC) markers in at least one simulated lithographic pattern generated employing a set of lithographic processing conditions and data preparation parameters, wherein each of the ORC markers includes a region of the at least one simulated lithographic pattern that includes a dimension less than a minimum dimension in rule of an optical rule checker; generating a minimum dimension region around each of the set of ORC markers, wherein each minimum dimension region has the minimum dimension throughout an entirety of a length thereof; generating a failure region around each of the set of ORC markers by subtracting areas of line patterns or space patterns from each of the minimum dimension regions; and generating a figure of demerit by adding all areas of the failure regions. The lithography apparatus is configured to print a lithographic pattern on a substrate employing one of the at least one simulated lithographic pattern by selecting a simulated lithographic pattern having a least figure of demerit among the generated at least one figure of demerit or after verifying a figure of demerit of a selected simulated lithographic pattern is less than a predefined criterion.

According to yet another aspect of the present disclosure, a non-transitory machine-readable data storage device is provided that embodies a program of machine-readable instructions that can be performed in a computing means. The machine-readable instructions includes steps for: providing at least one simulated lithographic pattern, wherein each of the at least one simulated lithographic pattern is generated employing a set of lithographic processing conditions and data preparation parameters; identifying a set of optical rule checker (ORC) markers in each of the at least one simulated lithographic pattern, wherein each of the ORC markers includes a region of the at least one simulated lithographic pattern that includes a dimension less than a minimum dimension in rule of an optical rule checker; generating a minimum dimension region around each of the set of ORC markers, wherein each minimum dimension region has the minimum dimension throughout an entirety of a length thereof; generating a failure region around each of the set of ORC markers by subtracting areas of line patterns or space patterns from each of the minimum dimension regions; and generating a figure of demerit by adding all areas of the failure regions for each of the at least one simulated lithographic pattern.

BRIEF DESCRIPTION OF THE SEVERAL VIEWS OF THE DRAWINGS

FIG. 12 shows an exemplary apparatus according to an embodiment of the present disclosure.

DETAILED DESCRIPTION

Figure 1:
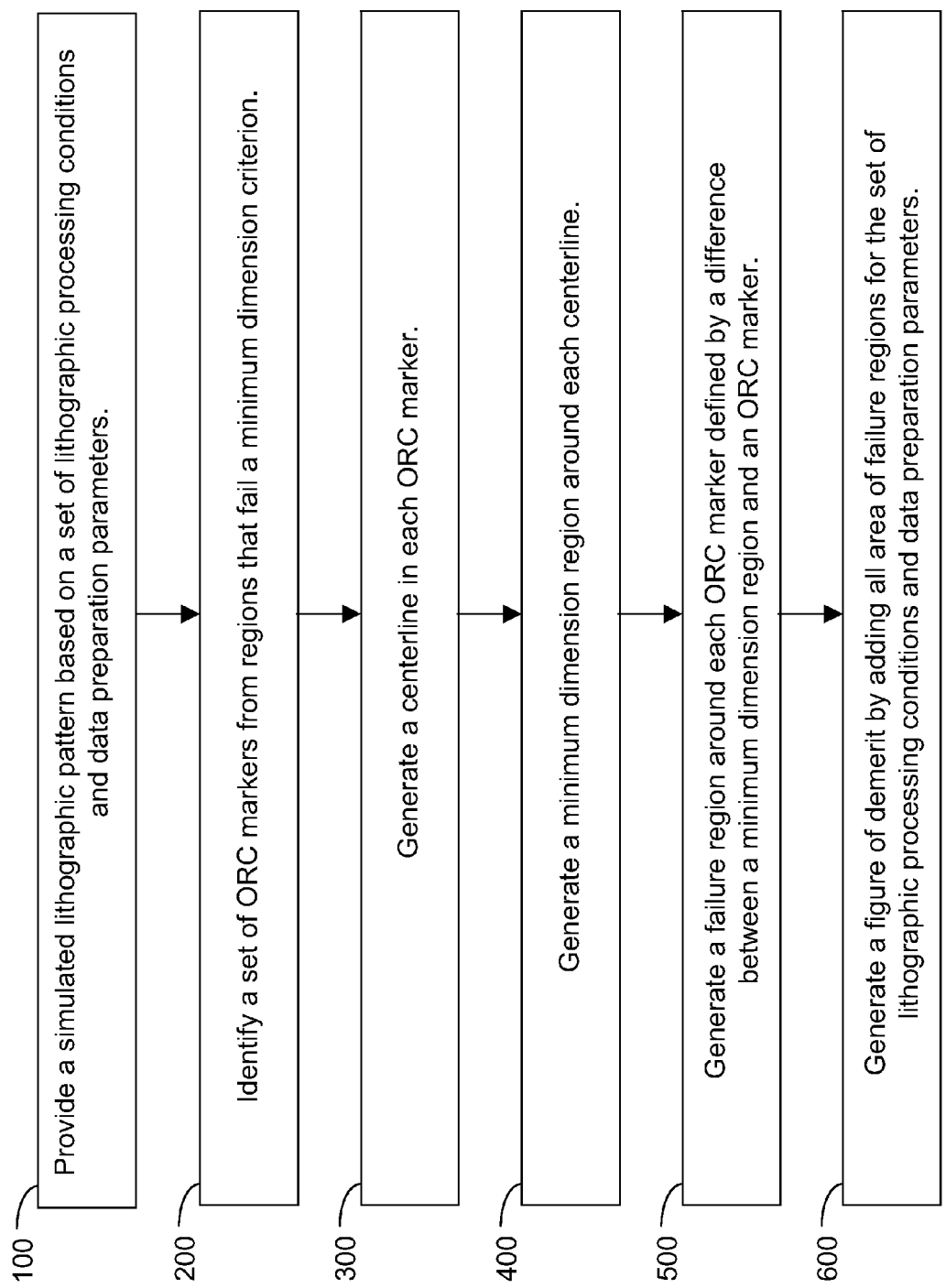
FIG. 1 is a first flow chart including a sequence of steps that can be employed to generate a figure of demerit according to an embodiment of the present disclosure.

As stated above, the present disclosure relates to a method for comparing and/or selecting a set of lithographic processing conditions and/or data preparation processes for printing a lithographic pattern, a system for performing the same, and a non-transitory machine-readable data storage device embodying a program for performing the same, which are now described in detail with accompanying figures. It is noted that like and corresponding elements are referred to by like reference numerals. The drawings are not in scale.

Referring to FIG. 1, a first flow chart includes a sequence of steps according to an embodiment of the present disclosure. The sequence of steps can be employed to generate a figure of demerit associated with a combination of a simulated lithographic pattern that is generated based on a set of lithographic processing conditions and data preparation parameters.

Referring to step 100, a simulated lithographic pattern is provided. A simulated lithographic pattern is a computer-generated pattern that simulates a physical lithographic pattern formed in a lithographically patterned photoresist. In one embodiment, a computing means, such as a computer, can be configured to run a program that generates the simulated lithographic pattern from a data set that represents a design for a lithographic mask. The simulated lithographic pattern is generated based on a set of lithographic processing conditions and data preparation parameters. The set of lithographic processing conditions and data preparation parameters includes at least one lithographic exposure parameter and at least one parameter that correlates a dimension of a design for a lithographic mask to a physical dimension on a physical lithographic mask embodying the design.

If a lithographic mask manufactured based on the design is available, the data preparation parameters are fixed parameters and have the values previously employed to manufacture the lithographic mask. In this case, the set of lithographic processing conditions and data preparation parameters includes only lithographic processing conditions as variable parameters, while the data preparation parameters have the actual values employed to manufacture the lithographic mask. The lithographic processing conditions are selected from among all available combinations of lithographic parameters that can be employed in conjunction with the manufactured lithographic mask. The lithographic processing conditions may include the type of a photoresist material stack, the thicknesses of the layers in the photoresist material stack, and exposure parameters of an available lithography tool. The layers in the photoresist material stack may include a photoresist, at least one anti-reflective coating layer, and/or an optically planarizing layer. The exposure parameters may include the wavelength and numerical aperture of a lithographic exposure tool, a source shape of the lithographic exposure tool, exposure time, and the vertical distance between a focal plane and a surface of the photoresist material stack (which is typically referred to as the "focus" of the lithographic exposure tool), as well as other processing parameters associated with the lithographic exposure tool.

If a lithographic mask is yet to be manufactured, the data preparation parameters are variable parameters. As such, each data preparation parameter can be selected from an allowed range values. In this case, the set of lithographic processing conditions and data preparation parameters includes both lithographic processing conditions as discussed above and the data preparation parameters that can affect the physical structure of a lithographic mask yet to be manufactured. The lithographic processing conditions are selected from among all available combinations of lithographic parameters that can be employed in conjunction with a lithographic mask to be manufactured. The lithographic processing conditions may include the type of a photoresist material stack, the thicknesses of the layers in the photoresist material stack, and exposure parameters of an available lithography tool. The data preparation parameters can include any parameter in a data preparation program that operates on a data set representing a design for a lithography mask to determine physical dimensions of features in a physical mask that is manufactured based on the design. For example, the data preparation parameters can include offsets to line width or offsets to spacing between lines. Typically, the values of such offsets depend on the value of the line width or the spacing in a feature in the design as well as the nature of the feature in the design.

Given a simulation program, a simulated lithographic pattern is uniquely defined for a given design for a lithographic mask and a complete set of lithographic processing conditions and data preparation parameters. Modifying at least one parameter within a complete set of lithographic processing conditions and data preparation parameters modifies the simulated lithographic pattern accordingly.

It is also possible to provide a simulated lithographic pattern to a computing means by importing the simulated lithographic pattern from a non-transitory machine-readable data storage device or through a transitory machine-readable signal (e.g., through wireless signal transmission). In this case, one computing means can be employed to generate the simulated lithographic pattern, and another computing means can be employed to perform the step of importing the simulated lithographic pattern to perform subsequent processing steps in the first flow chart.

Figure 3:
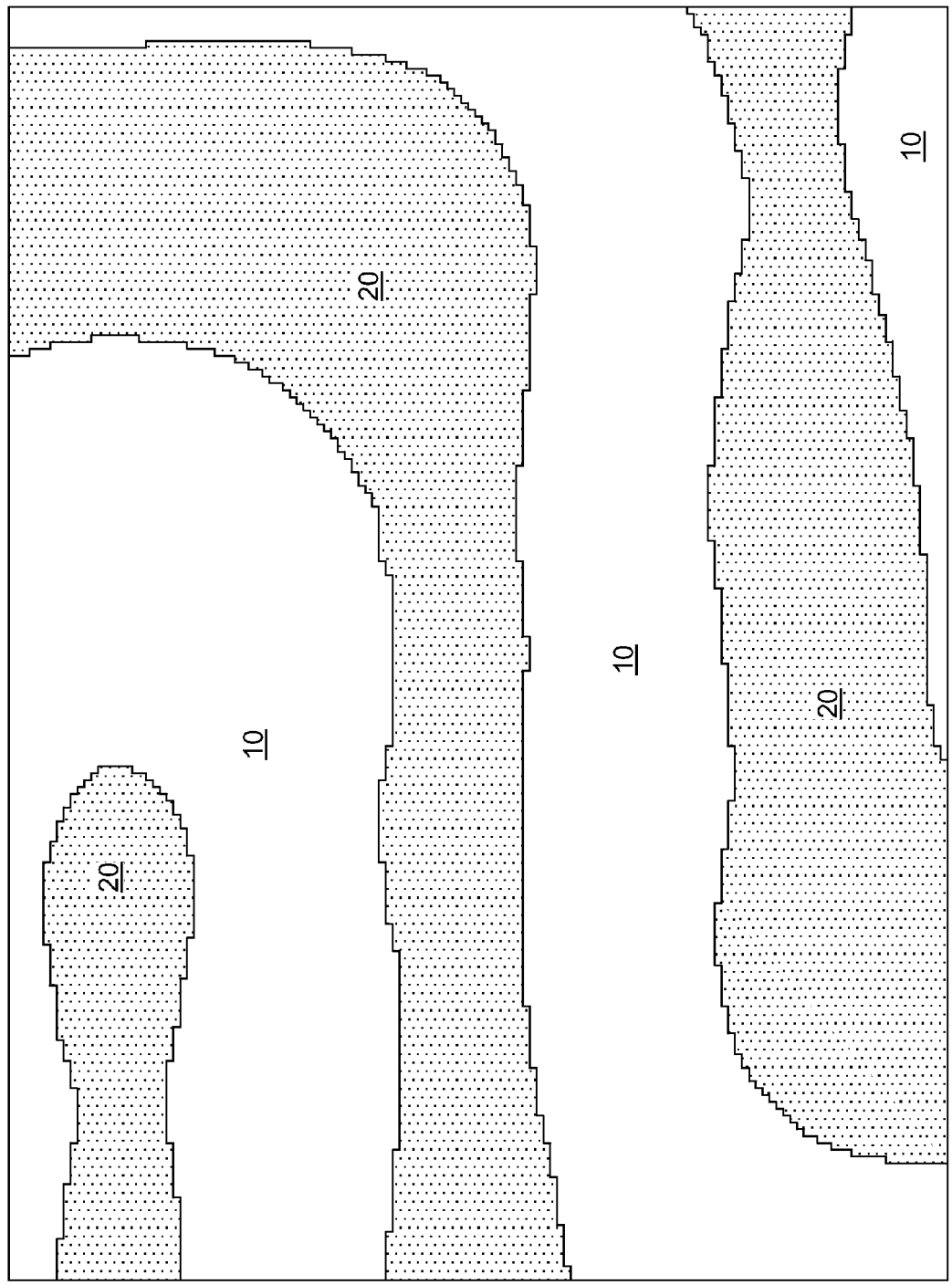
FIG. 3 is an illustrative schematic that shows an exemplary simulated lithographic pattern according to an embodiment of the present disclosure.

Referring to FIG. 3, an exemplary simulated lithographic pattern is illustrated. The exemplary simulated lithographic pattern includes space patterns 10 and line patterns 20 that complementarily fill the entire area of the exemplary simulated lithographic pattern. Depending on the type of the lithographic mask (a positive mask or a negative mask) and the type of photoresist to be subsequently exposed and developed (a positive photoresist or a negative photoresist), the line patterns 20 may correspond to areas in which the developed photoresist is to be present or is to be absent. The space patterns 10 correspond to the complementary areas of the photoresist features corresponding to the line patterns 20 in the simulated lithographic pattern.

Typically, a simulated lithographic pattern employs a grid having a predefined resolution, which is the minimum distance that any change in a feature must have in order to register such a change. For example, for a simulated lithographic pattern in which a critical dimension, i.e., a minimum feature size, is 32 nm, the predefined resolution can be 2 nm, 1 nm, or 0.5 nm. Thus, neighboring grid lines (not shown) employed by a simulated lithographic pattern are spaced by the predefined resolution, and all features of the simulated lithographic pattern "snaps" onto the grid, i.e., registers to the nearest grid line if any feature happens to fall between two adjacent grid lines. Thus, simulated lithographic patterns are digitized so that all features snaps on the grid employed in the simulated lithographic patterns as illustrated in the exemplary simulated lithographic pattern in FIG. 3. While the method of the present disclosure is described employing an exemplary simulated lithographic pattern registered to a grid, a grid is not necessary to practice the method of the present disclosure, and it is also possible to apply the method of the present disclosure to a simulated lithographic pattern that does not employ a grid for features.

Referring to step 200, a set of optical rule checker (ORC) markers are identified within the simulated lithographic pattern. Each ORC marker is a shape that is a subset of the patterned areas within the simulated lithographic pattern. Each ORC marker is located in a region in which an ORC rule is violated.

An ORC rule can specify a minimum dimension that a type of features must include. In this case, a feature in the simulated lithographic pattern that has less than the minimum dimension specified in the ORC rule violates the ORC rule. For example, the ORC rules can include a minimum line width rule, which specifies the minimum dimension that all line features in the simulated lithographic pattern must have except near end portions of the line features due to corner rounding. Any line feature that includes a portion having a width less than the minimum line width at a location other than end portions of the line feature violates the ORC rule. Similarly, the ORC rules can include a minimum spacing rule, which specifies the minimum dimension that any spacing between adjacent line features in the simulated lithographic pattern must have. Any line feature that includes a portion having a spacing less than the minimum spacing violates the ORC rule.

Each ORC marker can be automatically identified by performing a program that analyzes local features of the simulated lithographic pattern. Depending on the nature of the ORC rule that the simulated lithographic pattern is checked against, different algorithms can be employed to identify a set of ORC markers.

Figure 4:
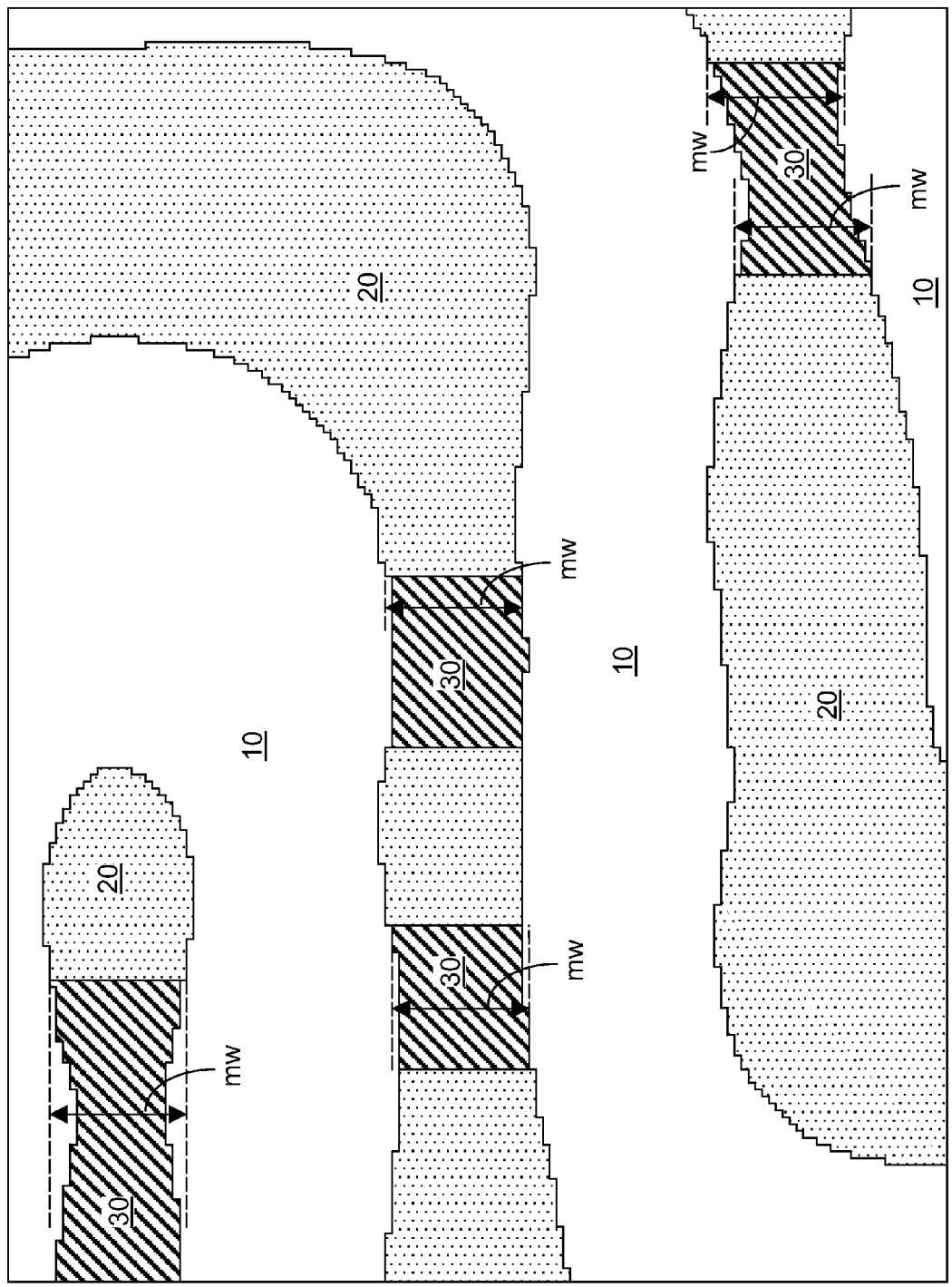
FIG. 4 is an illustrative schematic that shows optical rule checker (ORC) markers according to an embodiment of the present disclosure.

Referring to FIG. 4, a set of ORC markers 30 can be generated by selecting a subset of areas of the line patterns 20 within the exemplary simulated lithographic pattern illustrate in FIG. 3. Each of the ORC marker 30 includes a region of the at least one simulated lithographic pattern that includes a dimension less than a minimum dimension in rule of an optical rule checker (ORC). In one embodiment, the subset of the areas of the line patterns 20 that is included in the set of ORC markers 30 can include only the areas of the line patterns 20 that have less than a minimum width mw and is located at least a predefined distance away from an end of a line pattern 20. While the areas of the set of ORC markers 30 are shown over the areas of the line patterns 20 in FIG. 4, it is understood that the areas of the line patterns 20 in FIG. 4 is the same as in FIG. 3, and the areas of the set of ORC markers 30 overlies, i.e., coincide with, portions of the areas of the line patterns 20.

The minimum width mw can be the same as a minimum physical dimension as defined in design rules for semiconductor devices, or can be greater than the minimum physical dimension by a predefined tolerance dimension to ensure enhance reliability of semiconductor devices. The boundaries of the set of ORC marker 30 can be selected such that end line portions, which are the vertical portions of the ORC markers 30 in FIG. 4 that crosses over the areas of the line patterns 20, are located at a boundary at which a dimension of simulated lithographic pattern changes from below the minimum dimension mw to at least the minimum dimension mw. Thus, if any area of the line patterns 20 has a width that is less than the minimum dimension mw and is not located in an end portion of a line pattern 20, then that area belongs to an ORC marker 30. Conversely, if any area of the line patterns 20 has a width that is equal to, or greater than, the minimum dimension mw or is located within a predetermined distance from an end of a line pattern 20, then that area does not belongs to an ORC marker 30.

While the present disclosure illustrates generation of a set of ORC markers from a subset of the line patterns 20, it is understood that another set of ORC markers can be generated from a subset of space patterns 10 employing an ORC rule that applies to the space pattern, e.g., a rule that specifies a minimum spacing between adjacent line patterns 10. The generation of the other set of ORC markers from a subset of space patterns 10 can be performed in addition to, or in lieu of, the generation of the set of ORC markers from a subset of the line patterns 20.

Referring to step 300 in the first flow chart, a centerline is generated in each ORC marker 30. The step 300 in the first flow chart can be performed employing the steps of the second flow chart in FIG. 2. The entirety of the steps in the second flow chart in FIG. 2 can correspond to the step 300 in the first flow chart in FIG. 1. The sequence of steps illustrated in the second flow chart of FIG. 2 is a non-limiting example of generating a centerline in each ORC marker 30.

Figure 2:
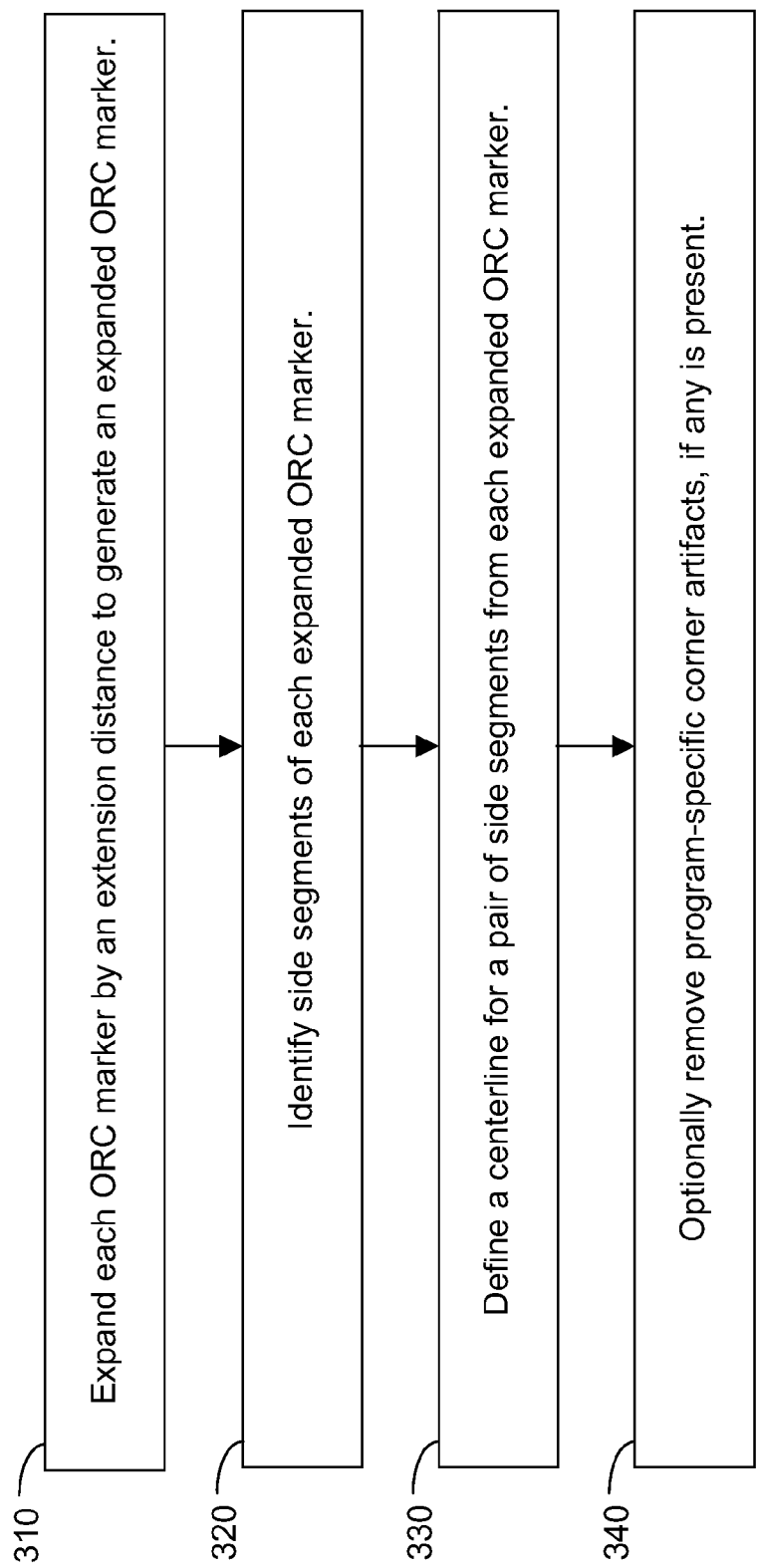
FIG. 2 is a second flow chart including a sequence of steps that can be employed to generate a centerline in optical rule checker (ORC) marker according to an embodiment of the present disclosure.
Figure 5:
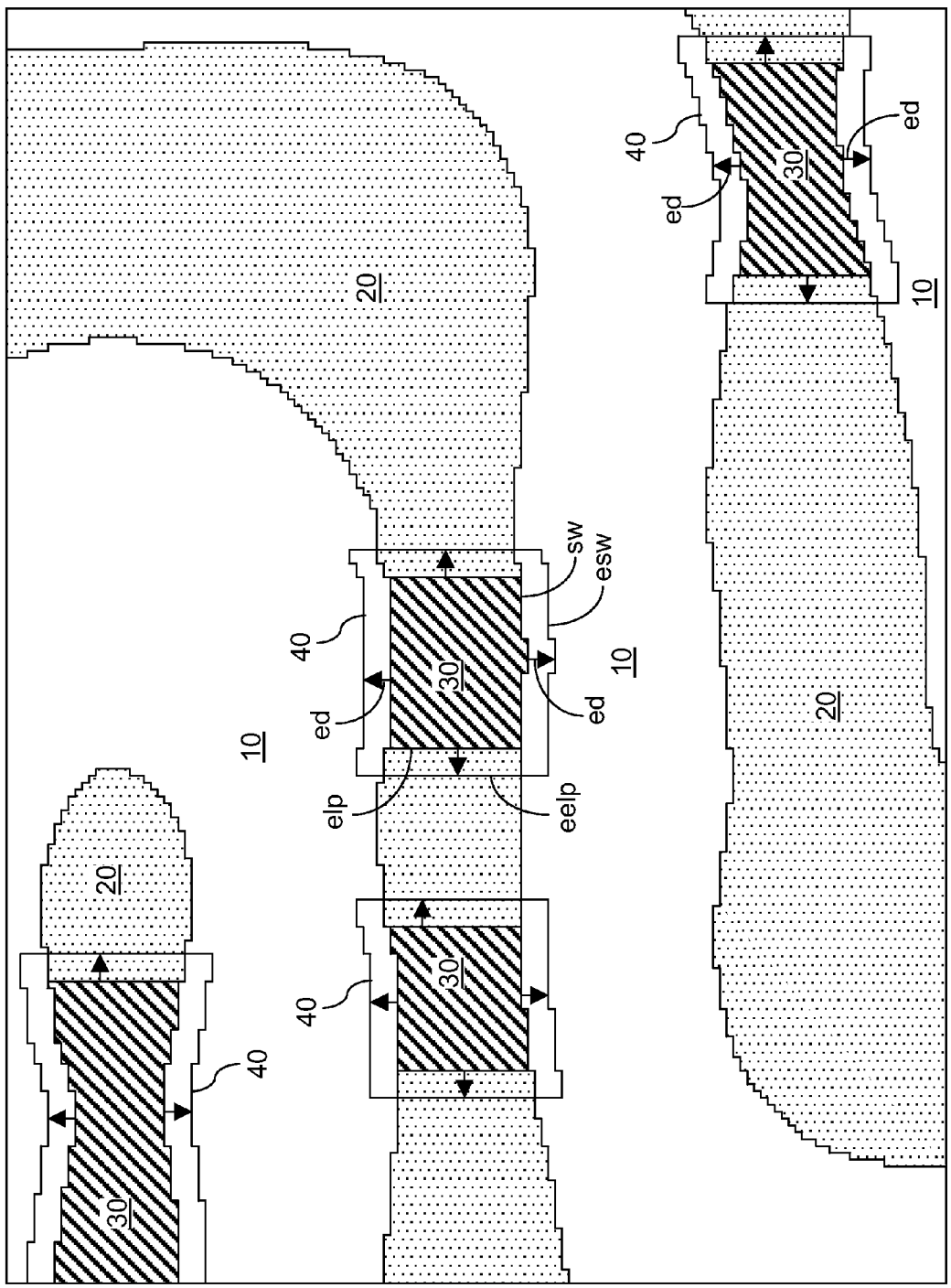
FIG. 5 is an illustrative schematic that shows expanded optical rule checker (ORC) markers according to an embodiment of the present disclosure.

Referring to step 310 in FIG. 2, each ORC marker in a simulated lithographic pattern can be expanded by an extension distance to generate an expanded ORC marker. Generation of an expanded ORC marker is illustrated in FIG. 5, which shows an expanded ORC marker 40 for each ORC marker 30 in the exemplary simulated lithographic pattern. Each shape of the expanded ORC marker 40 is generated by expanding the end line portions elp (the vertical portions of the ORC markers 30 in FIG. 5) to form a pair of expanded end line portions eelp by an expansion distance ed, and expanding the sidewalls sw of the line pattern 20 between the pair of expanded end line portions eelp to form expanded sidewalls esw. A pair of expanded sidewalls esw and a pair of expanded end line portions eelp collectively form an expanded ORC marker 40. The expansion distance ed can be a predetermined number, and is typically less than the minimum dimension mw. For example, if the minimum dimension mw is 32 nm, the expansion distance can be from 1 nm to 10 nm, although lesser and greater expansion distances can also be employed.

Figure 6:
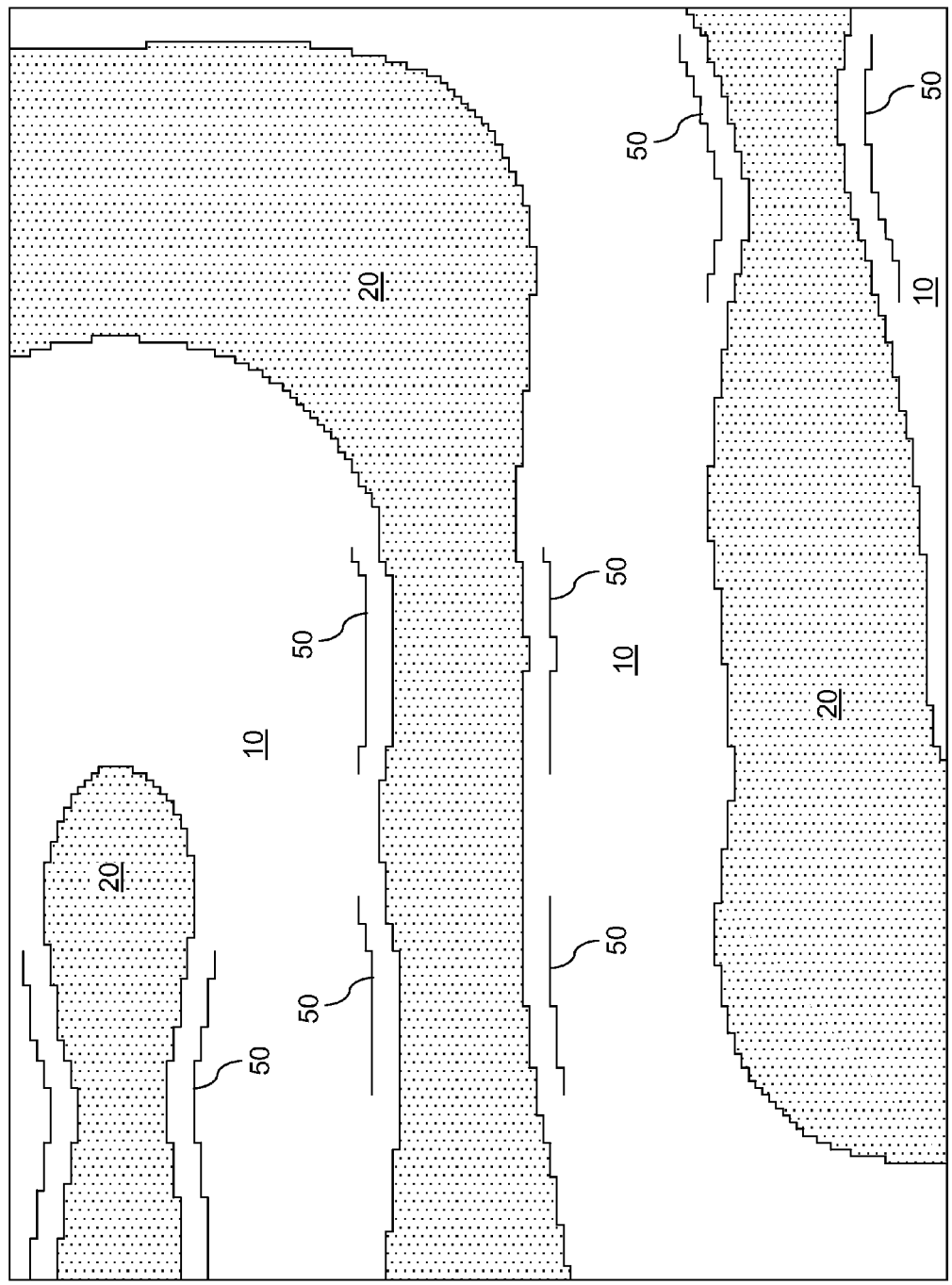
FIG. 6 is an illustrative schematic that shows a pair of side segments for each expanded ORC marker according to an embodiment of the present disclosure.

Referring to step 320 in FIG. 2, a pair of side segments can be identified in each expanded ORC marker 40. Identification of a pair of side segments is illustrated in FIG. 6, which shows a par of side segments 50 for each expanded ORC marker 40 (See FIG. 5). The pair of side segments 50 is identical with the pair of expanded end line portions eelp in FIG. 5.

Figure 7:
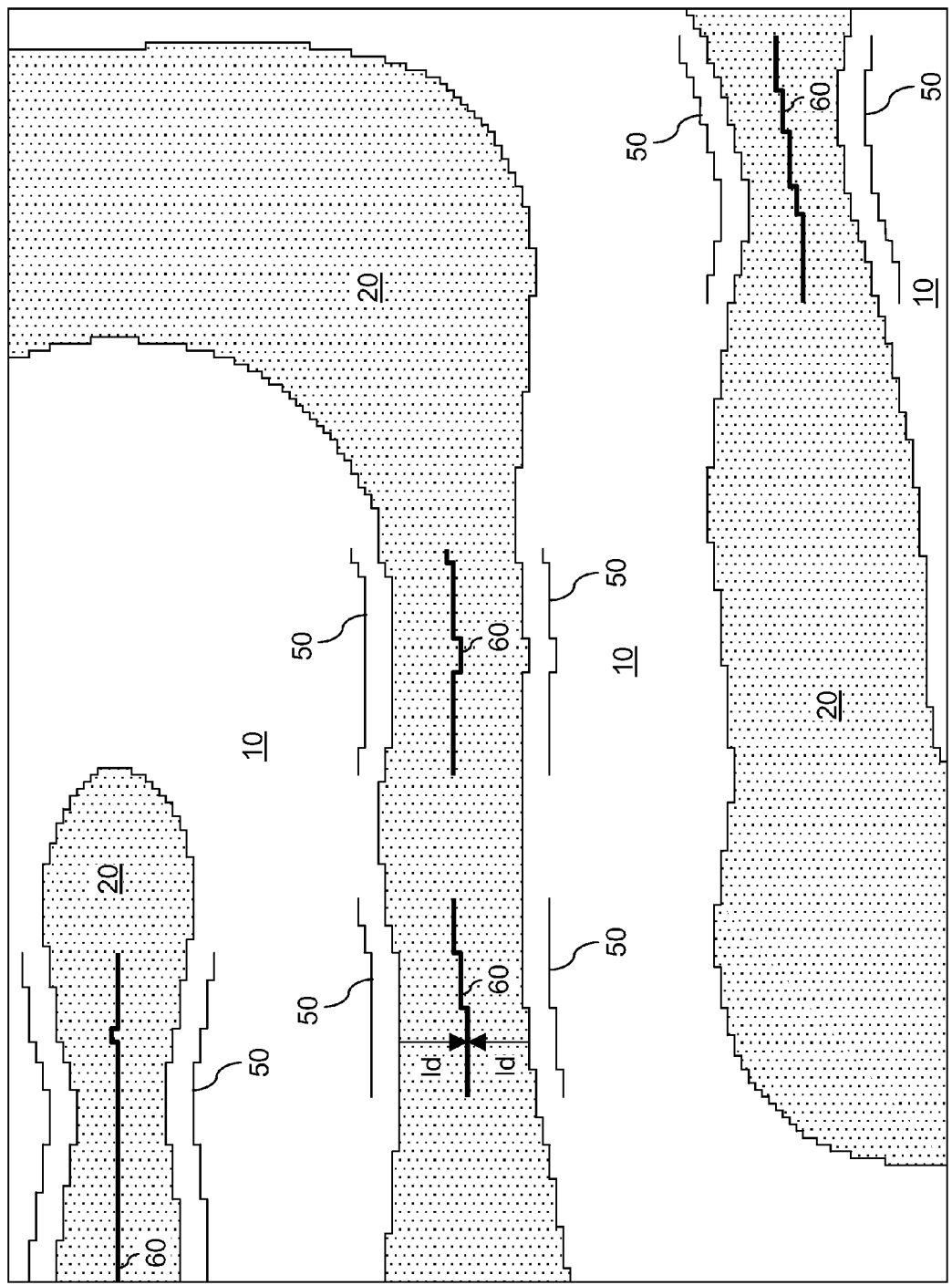
FIG. 7 is an illustrative schematic that shows a centerline for each pair of side segments according to an embodiment of the present disclosure.

Referring to step 330 in FIG. 2, a centerline is defined for each pair of side segments 50 from each expanded ORC marker 40. Definition of the centerline is illustrated in FIG. 7, which shows a centerline 60 for each pair of side segments 50. Each centerline 60 can be defined by identifying a set of continuous line segments that is equidistant, within a resolution of a grid of the simulated lithographic pattern, from the pair of side segments 50 within the expanded ORC marker 40. Side segments 50 are spaced from a side edge, i.e., a sidewall, of an ORC marker 30 by the expansion distance ed. Correspondingly, each point in the centerline 50 is located at a same lateral distance ld, within a resolution of a grid of the simulated lithographic pattern, from two sidewall portions of the ORC marker 30 around the centerline 60. The lateral distance ld is measured in a direction perpendicular to the lengthwise direction of the centerline 60, which is along the lengthwise direction of the corresponding OPC marker 30. The lateral distance ld is a variable that can vary from point to point within the centerline 60.

Referring to step 340 in FIG. 2, in case any program-specific corner artifacts are generated during or after steps 310, 320, and/or 330, such program-specific corner artifacts may be removed by an automated pattern recognition program. Such program-specific corner artifacts are highly program specific, and methods of removing such program-specific corner artifacts can be adjusted as needed. In some program, such corner artifacts may be absent, and the step 340 may be unnecessary.

Figure 8:
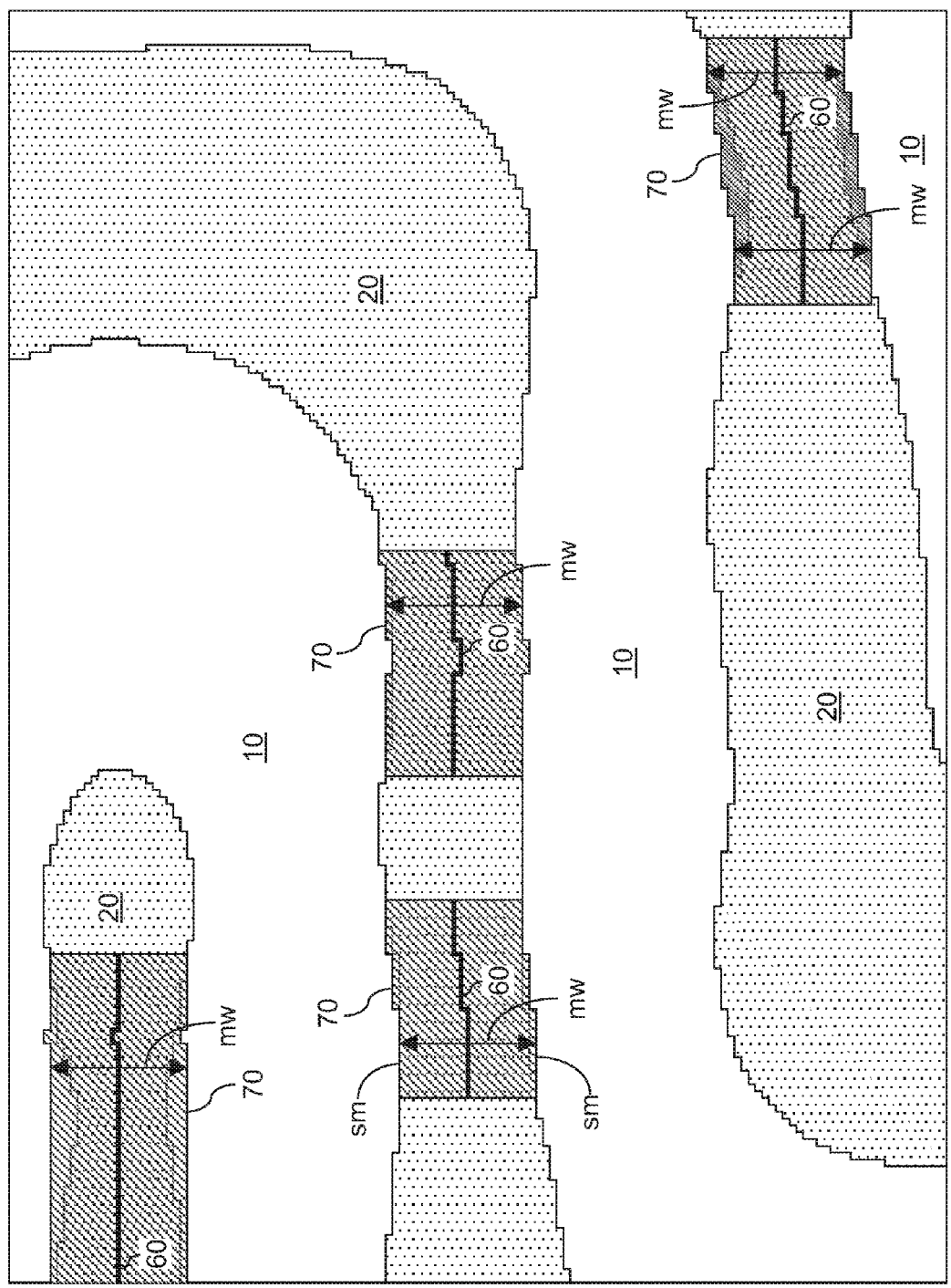
FIG. 8 is an illustrative schematic that shows minimum dimension regions generated around centerlines according to an embodiment of the present disclosure.

Referring to step 400 in the first flow chart in FIG. 1, a minimum dimension region is generated around each centerline 60. Generation of a minimum dimension region is illustrated in FIG. 8, which shows a minimum dimension region 70 for each centerline 60. Each minimum dimension region 70 has the minimum dimension mw throughout an entirety of a length thereof, i.e., from one expanded end line portion eelp to the other expanded end line portion eelp in each expanded ORC marker 40 (See FIG. 5). The sidewalls sm of each minimum dimension region 70 is laterally spaced from a centerline 60 by one half of the minimum dimension mw. In general, a minimum dimension region 70 is generated around each of the set of ORC markers 30 (See FIG. 4).

Figure 9:
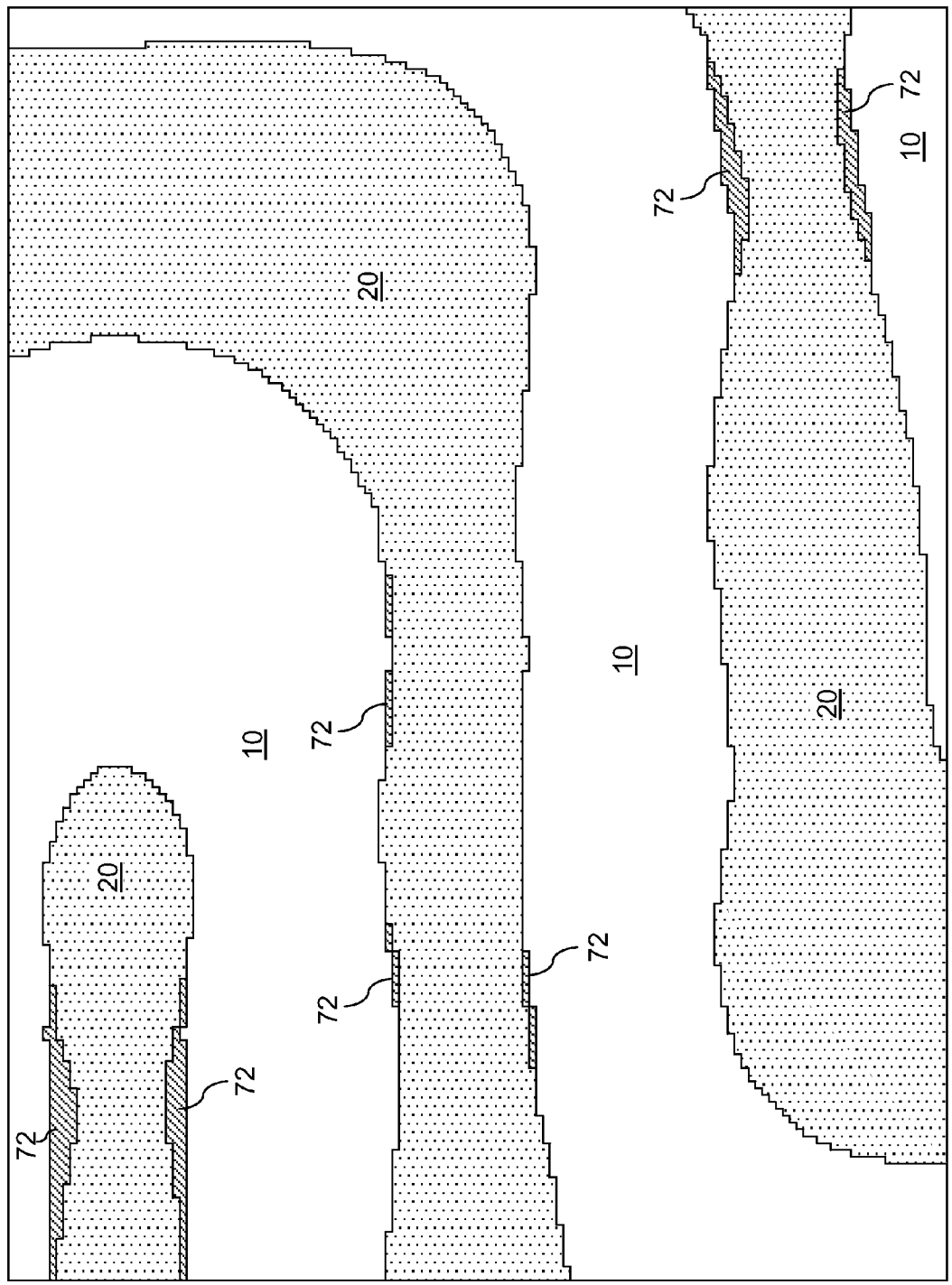
FIG. 9 is an illustrative schematic that shows failure regions according to an embodiment of the present disclosure.

Referring to step 500 in the first flow chart in FIG. 1, a failure region is generated around each of the set of ORC markers 30 by subtracting areas of the line patterns 20 from each of the minimum dimension regions 70. As used herein, "subtracting" or "subtraction of" areas is performed as defined in set theory. Specifically, subtraction of a second element from a first element refers to removal of the common component between the first element and the second element from the first element to generate a third element that includes only the subset of the first element that does not belong to the second element. Generation of a failure region is illustrated in FIG. 9, which shows failure regions 72 that are generated by removing areas common to the minimum dimension regions 70 and the line patterns 20 from the areas of the minimum dimension region 70. Correspondingly, the failure regions 72 include only areas that are located within the minimum dimension region 70 and not included in the line pattern 20. As in FIGS. 4-8, the line patterns 20 in FIG. 9 are identical to the line patterns 20 in FIG. 3.

In embodiments not illustrated herein, a set of ORC markers can be generated from a subset of the space patterns 10. In such embodiments, failure regions (not shown) are generated by removing areas common to the minimum dimension regions (not shown) and the space patterns 10 from the areas of minimum dimension regions formed around a subset of the spacer patterns 10 and infringes on the peripheries of the line patterns 20. Correspondingly, the failure regions include only areas that are located within the minimum dimension region and not included in the space pattern 10.

In general terms, a failure region 72 is generated around each of a set of ORC markers 30 (See FIG. 4) by subtracting areas of line patterns 20 or space patterns 10, depending on embodiments, from each of minimum dimension regions 70. A failure region 72 around an ORC marker 30 can include multiple disjoined portions as illustrated in FIG. 8.

Referring to step 600 in the first flow chart in FIG. 1, a figure of demerit is generated by adding all areas of the failure regions 72 for the simulated lithographic pattern. As used herein, a figure of demerit refers to a single scalar number assigned to a simulated lithographic pattern. Thus, a unique scalar number can be assigned to a simulated lithographic pattern associated with a design for a lithographic mask and a single set of lithographic processing conditions and data preparation parameters. The greater the total area of failure regions, the less desirable it is to implement the combination of the design for the lithographic mask and the selected set of lithographic processing conditions and data preparation parameters. Because the figure of demerit is the total area of failure regions, the greater the figure of demerit, the less desirable to implement the combination of the design for the lithographic mask and the selected set of lithographic processing conditions and data preparation parameters.

The figure of "demerit" can be easily converted to a figure of "merit," for example, by multiplying −1, or by taking an inverse, or by performing any mathematical operation that generated an incrementally greater figure of merit for incrementally lesser figure of demerit through the entire range of values for the figure of demerit. Thus, it is noted that any comparison operation employing a figure of demerit can be replaced by a comparison operation employing a figure of merit derived from the figure of demerit.

The method illustrated in the first flow chart in FIG. 1 can be implemented by a system including a computing means such as a computer that is configured to run an automated program. The system can also include a lithographic tool that is configured to print a lithographic pattern on a substrate employing a simulated lithographic pattern.

Figure 10:
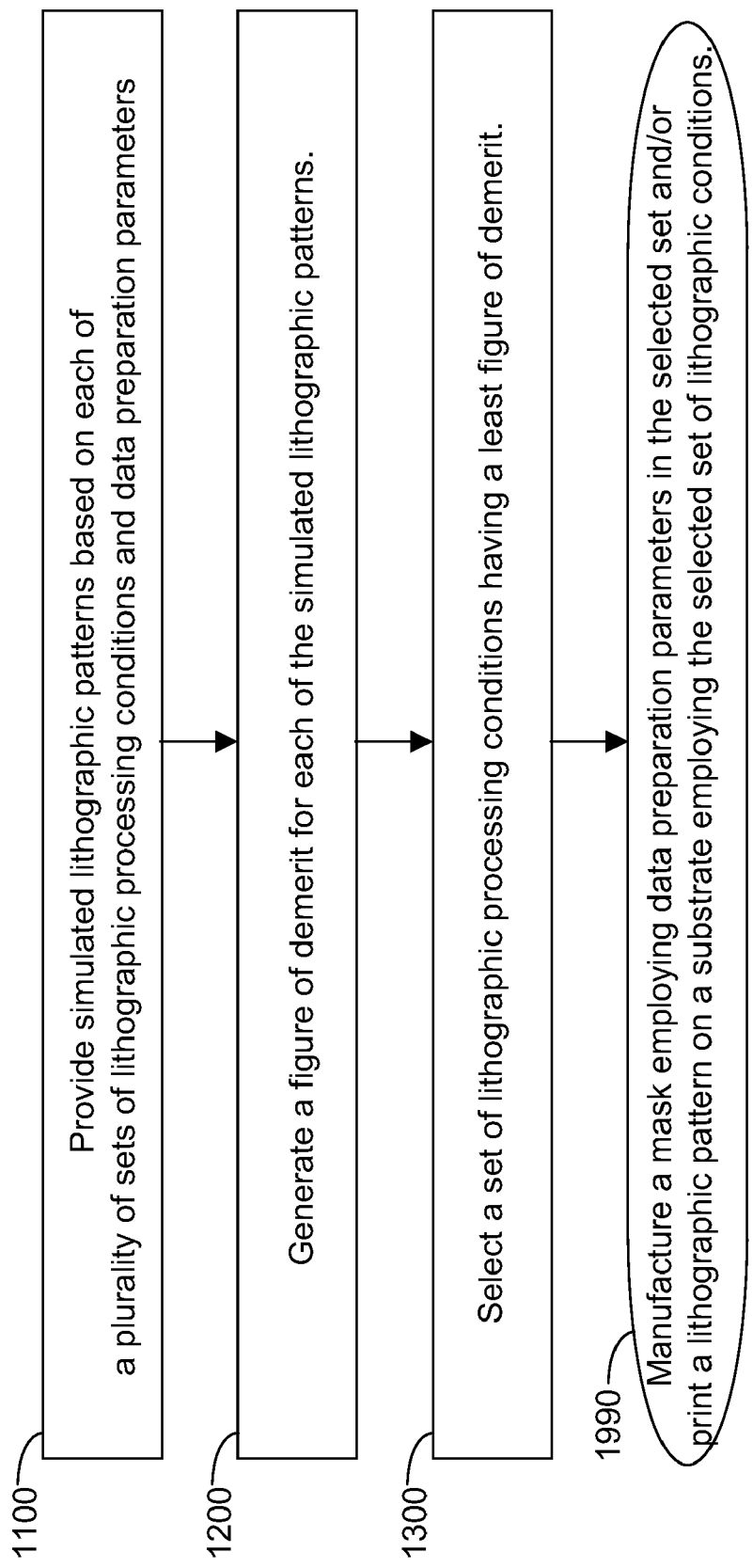
FIG. 10 is a third flow chart for a sequence of steps for selecting a set of lithographic processing conditions and data preparation parameters to be used for printing a lithographic pattern according to an embodiment of the present disclosure.

In one embodiment, the simulated lithographic pattern to be employed in a lithographic tool can be selected from a plurality of simulated lithographic patterns for which the figure of demerit is calculated employing the method in the first flow chart in FIG. 1. Referring to FIG. 10, a third flow chart illustrates this embodiment.

Referring to step 1100, a plurality of simulated lithographic patterns are provided. The plurality of simulated lithographic patterns can employ multiple sets of lithographic processing conditions and data preparation parameters for a given design for a lithographic mask. Each set of lithographic processing conditions and data preparation parameters corresponds to a simulated lithographic pattern within the plurality of simulated lithographic patterns. Depending on whether the lithographic mask has been previously manufactured, the types of variable parameters in the plurality of sets of lithographic processing conditions and data preparation parameters can be different as discussed above regarding step 100 of the first flow chart in FIG. 1. Step 1100 can be performed by repeating the step 100 of the first flow chart in FIG. 1 for each of the plurality of simulated lithographic patterns.

Referring to step 1200, a figure of demerit is generated for each of the plurality of simulated lithographic patterns. The figures of demerit can be generated by performing the steps 200-600 in the first flow chart in FIG. 1 for each of the plurality of simulated lithographic patterns provided in step 1100.

Referring to step 1300, a simulated lithographic pattern having a least figure of demerit is selected among the plurality of figure of demerit. In other words, the selected simulated lithographic pattern has the least figure of demerit among the plurality of simulated lithographic patterns provided at step 1100.

Referring to step 1990, the information generated at steps 1200 and 1300 can be employed to effectively run a semiconductor manufacturing facility. For example, if a lithographic mask embodying the design employed to generate the plurality of simulated lithographic patterns needs to be manufactured, a lithographic mask can be manufactured employing the data preparation parameters in the selected set of lithographic processing conditions and data preparation parameters. Further, once the lithographic mask is manufactured and is available for use, a lithographic pattern can be printed on a substrate employing the selected set of lithographic processing conditions, i.e., the lithographic processing conditions within the selected set of lithographic processing conditions and data preparation parameters. If a lithographic mask is manufactured prior to performing the steps of the third flow chart, the data preparation parameters employed to generate the plurality of simulated lithographic patterns are matched to the actual values for the data preparation parameters employed to manufacture the lithographic mask. Upon determination of the simulated lithographic pattern that provides the least figure of demerit, the lithographic processing conditions corresponding to that simulated lithographic pattern can be employed in a lithographic tool to print a lithographic pattern on a substrate. In this case, the lithographic pattern printed on the substrate matches the simulated lithographic pattern that has the least figure of demerit among the plurality of simulated lithographic patterns.

Figure 11:
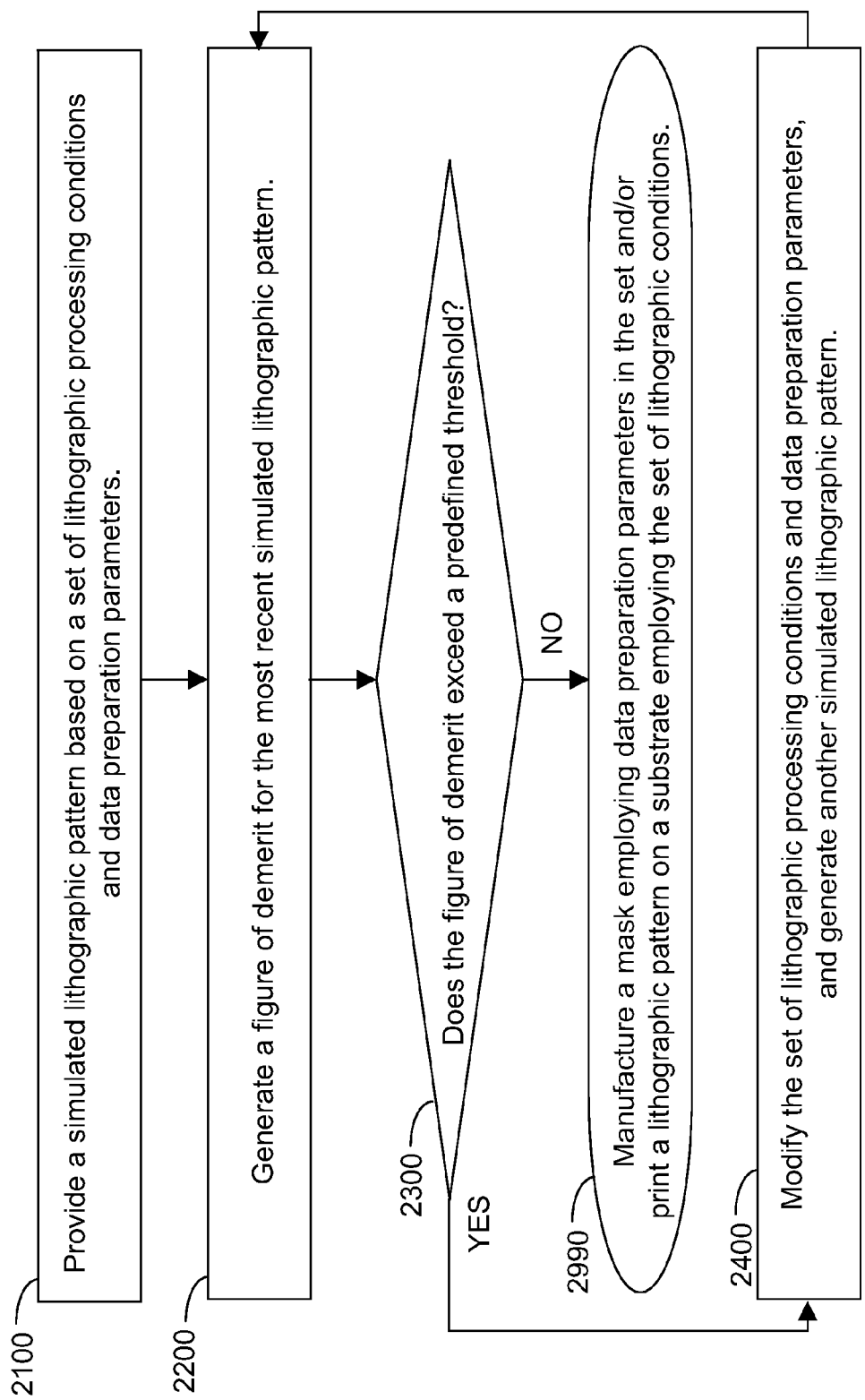
FIG. 11 is a fourth flow chart for a sequence of steps for generating a set of lithographic processing conditions and data preparation parameters to be used for printing a lithographic pattern according to an embodiment of the present disclosure.

Referring to FIG. 11, a fourth flow chart illustrates another embodiment of the present disclosure. In this embodiment, a computing means can be employed to iteratively modify a simulated lithographic pattern to provide a figure of demerit that does not exceed a predetermined threshold value. If the figure of demerit for the simulated lithographic pattern as originally provides exceeds the predetermined threshold value, the set of lithographic processing conditions and data preparation parameters are modified until a figure of demerit generated from the modified set of lithographic processing conditions and data preparation parameters does not exceed the predetermined maximum value.

Referring to step 2100, a simulated lithographic pattern based on a set of lithographic processing conditions and data preparation parameters is provided. The simulated lithographic pattern can be provided employing the same method that can be employed in step 100 in the first flow chart in FIG. 1.

Referring to step 2200, a figure of demerit is generated for the simulated lithographic patterns. The figures of demerit can be generated by performing the steps 200-600 in the first flow chart in FIG. 1 for the simulated lithographic pattern provided in step 2100.

Referring to step 2300, the figure of demerit is compared with a predetermined threshold value for the figure of demerit, i.e., a predetermined maximum value as an acceptable value for the figure of demerit. Step 2300 determines whether the figure of demerit exceeds the predetermined maximum value for the figure of demerit.

If the figure of demerit does not exceed the predetermined maximum value for the figure of demerit at step 2300, the process flow proceeds to step 2900. At step 2900, the information generated at steps 2300 can be employed to effectively run a semiconductor manufacturing facility. For example, if a lithographic mask embodying the design employed to generate the plurality of simulated lithographic patterns needs to be manufactured, a lithographic mask can be manufactured employing the data preparation parameters in the set of lithographic processing conditions and data preparation parameters associated with the simulated lithographic pattern that passes the test at step 2300, i.e., provides a figure of demerit that does not exceed the predetermined threshold value. Further, once the lithographic mask is manufactured and is available for use, a lithographic pattern can be printed on a substrate employing the selected set of lithographic processing conditions, i.e., the lithographic processing conditions within the set of lithographic processing conditions and data preparation parameters. The lithographic pattern printed on the substrate matches the simulated lithographic pattern that has the figure of demerit less than the predetermined maximum value.

If the figure of demerit exceeds the predetermined maximum value for the figure of demerit at step 2300, the process flow proceeds to step 2400. The set of lithographic processing conditions and data preparation parameters is modified to generate another simulated lithographic pattern. The process flow then proceeds to step 2200 again to generate a figure of demerit for the most recent simulated lithographic pattern, i.e., the simulated lithographic pattern as generated at step 2400 in the most recent pass therethrough. The process flow then proceeds to step 2300 to determine if the most recent figure of demerit exceeds the predetermined threshold value.

In general, steps 2400, 2200, and 2300 are iteratively performed until the most recent figure of demerit is less than the predetermined threshold value. Thus, at least one parameter among the set of lithographic processing conditions and data preparation parameters is iteratively modified until a corresponding figure of demerit is less than the predetermined maximum value for the figure of demerit. The iterative process is repeated until the process flow proceeds to step 2990 after generating a figure of demerit that does not exceed the predetermined maximum value. The lithographic pattern printed on the substrate at step 2990 corresponds to a modified simulated lithographic pattern employing a modified set of lithographic processing conditions and data preparation parameters that provides a figure of demerit that does not exceed the predetermined maximum value.

The methods of the present disclosure may be employed in conjunction with an automated process to minimize the figure of demerit, for example, by automatically adjusting the litho or data prep parameters until a minimum value for the figure of demerit is achieved. Levenberg-Marquardt is one such algorithm that can be used for such automated process. The ability to apply such an optimization algorithm to the problem of optimizing lithography and data preparation process is one unique application that a continuously-varying figure of demerit can provide, and not provided by other methods known in the art.

Steps 2100, 2200, 2300, and 2400 in the fourth flow chart can be performed by a computing means employing an automated program. The computing means is configured to store the modified set of lithographic processing conditions and data preparation parameters in a non-transitory machine-readable data storage device. The information stored in the non-transitory machine-readable data storage device can be transmitted to a lithography tool by signal transmission through wired communication, wireless communication, or transport of a the non-transitory machine-readable data storage device if the non-transitory machine-readable data storage device is portable to enable the printing of the lithographic pattern on the substrate.

Further, a non-transitory machine-readable data storage device can be employed to embody a program of machine-readable instructions that can be performed in a computing means. The machine-readable instructions can include steps in the various flow charts in FIG. 1, 2, 10, or 11, any portion thereof, or any combination thereof. The program of machine-readable instructions can be transferred to a computing means to perform the various steps described above.

Referring to FIG. 9, an exemplary system 900 according to an embodiment of the present disclosure is shown. The exemplary system includes a computing device that is configured to perform program instructions. The computing device can include a memory and a processor device in communication with the memory. The program instructions can configure the computing device to perform the steps of embodiments of the present disclosure described above. The exemplary system 900 can be a computer-based system in which the methods of the embodiments of the disclosure can be carried out by an automated program of machine-executable instructions to generate information on at least one figure of demerit and any figure of merit derived therefrom.

The computer-based system includes a processing unit 910, which can be a computing device and houses a processor device, a memory and other systems components (not shown expressly in the drawing) that implement a general purpose or special purpose processing system, or can be a computer that can execute a computer program product. The computer program product can comprise data storage media, such as a compact disc, which can be read by the processing unit 910 through a disc drive 920. Alternately or in addition, the data storage media can be read by any means known to the skilled artisan for providing the computer program product to the general purpose processing system to enable an execution thereby. The exemplary system 900 can include a lithography tool 905 configured to print a lithographic pattern on a substrate. The lithography tool 905 can be any lithography tool known in the art provided that at least one lithographic processing parameter is a variable that can be changed.

The system includes at least the lithography tool 905, a memory, and a processor device in communication with the memory. The memory and the processor device are provided within the processing unit 910. The exemplary system can be configured to perform a method including the steps in the various flow charts in FIG. 1, 2, 10, or 11, any portion thereof, or any combination thereof.

A data storage device that is programmable and readable by a machine and tangibly embodying or storing a program of machine-executable instructions that are executable by the machine to perform the methods described herein are also provided. For example, the automated program can be embodied, i.e., stored, in a machine-readable data storage devices such as a hard disk, a CD ROM, a DVD ROM, a portable storage device having an interface such as a USB interface, a magnetic disk, or any other storage medium suitable for storing digital data. The program of machine-executable instructions can be employed to generate information on at least one figure of demerit and any figure of merit derived therefrom.

The computer program product can comprise all the respective features enabling the implementation of the inventive method described herein, and which is able to carry out the method when loaded in a computer system. Computer program, software program, program, or software, in the present context means any expression, in any language, code or notation, of a set of instructions intended to cause a system having an information processing capability to perform a particular function either directly or after either or both of the following: (a) conversion to another language, code or notation; and/or (b) reproduction in a different material form.

The computer program product can be stored on hard disk drives within the processing unit 910, as mentioned, or can be located on a remote system such as a server 930, coupled to the processing unit 910, via a network interface such as an Ethernet interface. A monitor 940, a mouse 950 and a keyboard 960 are coupled to the processing unit 910, to provide user interaction. A scanner 980 and a printer 970 can be provided for document input and output. The printer 970 is shown coupled to the processing unit 910 via a network connection, but can be coupled directly to the processing unit 910. The scanner 980 is shown coupled to the processing unit 910 directly, but it should be understood that peripherals might be network coupled, or direct coupled without affecting the ability of the processing unit 910 to perform the method of the disclosure.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of printing a lithographic pattern on a substrate comprising:
   providing at least one simulated lithographic pattern, wherein each of said at least one simulated lithographic pattern is generated employing a set of lithographic processing conditions and data preparation parameters;
   identifying a set of optical rule checker (ORC) markers in each of said at least one simulated lithographic pattern, wherein each of said ORC markers includes a region of said at least one simulated lithographic pattern that includes a dimension less than a minimum dimension in rule of an optical rule checker;
   generating a minimum dimension region around each of said set of ORC markers, wherein each minimum dimension region has said minimum dimension throughout an entirety of a length thereof;
   generating a failure region around each of said set of ORC markers by subtracting areas of line patterns or space patterns from each of said minimum dimension regions;
   generating a figure of demerit by adding all areas of said failure regions for each of said at least one simulated lithographic pattern; and
   printing a lithographic pattern on a substrate employing one of said at least one simulated lithographic pattern by selecting a simulated lithographic pattern having a least figure of demerit among said at least one figure of demerit or after verifying that a figure of demerit of a selected simulated lithographic pattern is less than a predefined criterion.

2. The method of claim 1, further comprising identifying a centerline in each ORC marker, wherein each point in said centerline is located at a same lateral distance, within a resolution of a grid of said simulated lithographic pattern, from two sidewall portions of an ORC marker around said centerline.

3. The method of claim 2, wherein sidewalls of each minimum dimension region is laterally spaced from a centerline by one half of said minimum dimension.

4. The method of claim 2, wherein said centerline is identified by:
   expanding an ORC marker by a constant expansion distance to form an expanded ORC marker;
   identifying a pair of side segments of said expanded ORC marker; and
   identifying a set of continuous line segments that is equidistant, within a resolution of a grid of said simulated lithographic pattern, from said pair of side segments within said expanded ORC marker.

5. The method of claim 1, wherein each end line portion of said set of ORC markers is located at a boundary at which a dimension of simulated lithographic pattern changes from below said minimum dimension to at least said minimum dimension.

6. The method of claim 1, wherein said set of lithographic processing conditions and data preparation parameters includes at least one lithographic exposure parameter and at least one parameter that correlates a dimension of a design for a lithographic mask to a physical dimension on a physical lithographic mask embodying said design.

7. The method of claim 1, wherein said at least one simulated lithographic pattern is a plurality of simulated lithographic patterns, and said lithographic pattern is selected to match a simulated lithographic pattern that has the least figure of demerit among said plurality of simulated lithographic patterns.

8. The method of claim 1, wherein said at least one simulated lithographic pattern includes a simulated lithographic pattern, and said method includes:
   determining whether said figure of demerit is less than a predetermined maximum value for said figure of demerit;
   printing, if said figure of demerit does not exceed said predetermined maximum value for said figure of demerit, said lithographic pattern on said substrate; and
   iteratively modifying, if said figure of demerit exceeds said predetermined maximum value for said figure of demerit, at least one parameter among said set of lithographic processing conditions and data preparation parameters until a corresponding figure of demerit is less than a predetermined maximum value for said figure of demerit, wherein said lithographic pattern printed on said substrate corresponds to a modified simulated lithographic pattern employing a modified set of lithographic processing conditions and data preparation parameters that provides a figure of demerit that does not exceed said predetermined maximum value.

9. A system for printing a lithographic pattern on a substrate comprising a computing means and a lithography apparatus, wherein said computing means is configured to perform the steps of:
   identifying a set of optical rule checker (ORC) markers in at least one simulated lithographic pattern generated employing a set of lithographic processing conditions and data preparation parameters, wherein each of said ORC markers includes a region of said at least one simulated lithographic pattern that includes a dimension less than a minimum dimension in rule of an optical rule checker;

generating a minimum dimension region around each of said set of ORC markers, wherein each minimum dimension region has said minimum dimension throughout an entirety of a length thereof;

generating a failure region around each of said set of ORC markers by subtracting areas of line patterns or space patterns from each of said minimum dimension regions; and generating a figure of demerit by adding all areas of said failure regions, and wherein said lithography apparatus is configured to print a lithographic pattern on a substrate employing one of said at least one simulated lithographic pattern by selecting a simulated lithographic pattern having a least figure of demerit among said at least one figure of demerit or after verifying a figure of demerit of a selected simulated lithographic pattern is less than a predefined criterion.

10. The system of claim 9, wherein said computing means is configured to identify a centerline in each ORC marker, wherein each point in said centerline is located at a same lateral distance, within a resolution of a grid of said simulated lithographic pattern, from two sidewall portions of an ORC marker around said centerline.

11. The system of claim 10, wherein said computing means is configured to identify said centerline by:
 expanding an ORC marker by a constant expansion distance to form an expanded ORC marker;
 identifying a pair of side segments of said expanded ORC marker; and
 identifying a set of continuous line segments that is equidistant, within a resolution of a grid of said simulated lithographic pattern, from said pair of side segments within said expanded ORC marker.

12. The system of claim 9, wherein said computing means is configured to identify said set of ORC markers such that each end line portion of said set of ORC markers is located at a boundary at which a dimension of simulated lithographic pattern changes from below said minimum dimension to at least said minimum dimension.

13. The system of claim 9, wherein said set of lithographic processing conditions and data preparation parameters includes at least one lithographic exposure parameter and at least one parameter that correlates a dimension of a design for a lithographic mask to a physical dimension on a physical lithographic mask embodying said design.

14. The system of claim 9, wherein said at least one simulated lithographic pattern is a plurality of simulated lithographic patterns, and said lithographic pattern is selected to match a simulated lithographic pattern that has the least figure of demerit among said plurality of simulated lithographic patterns.

15. The method of claim 9, wherein said at least one simulated lithographic pattern includes a simulated lithographic pattern, and said computing means is configured to iteratively modify said simulated lithographic pattern by modifying said set of lithographic processing conditions and data preparation parameters until a figure of demerit generated from a modified set of lithographic processing conditions and data preparation parameters does not exceed said predetermined maximum value.

16. The method of claim 15, wherein said computing means is configured to store said modified set of lithographic processing conditions and data preparation parameters in a non-transitory machine-readable data storage device.

17. A non-transitory machine-readable data storage device embodying a program of machine-readable instructions that are performed in a computing means, wherein said machine-readable instructions includes steps for:
 providing at least one simulated lithographic pattern, wherein each of said at least one simulated lithographic pattern is generated employing a set of lithographic processing conditions and data preparation parameters;
 identifying a set of optical rule checker (ORC) markers in each of said at least one simulated lithographic pattern, wherein each of said ORC markers includes a region of said at least one simulated lithographic pattern that includes a dimension less than a minimum dimension in rule of an optical rule checker;
 generating a minimum dimension region around each of said set of ORC markers, wherein each minimum dimension region has said minimum dimension throughout an entirety of a length thereof;
 generating a failure region around each of said set of ORC markers by subtracting areas of line patterns or space patterns from each of said minimum dimension regions; and
 generating a figure of demerit by adding all areas of said failure regions for each of said at least one simulated lithographic pattern.

18. The non-transitory machine-readable data storage device of claim 17, wherein said machine-readable instructions includes steps for identifying a centerline in each ORC marker, wherein each point said centerline is located at a same lateral distance, within a resolution of a grid of said simulated lithographic pattern, from two sidewall portions of an ORC marker around said centerline.

19. The non-transitory machine-readable data storage device of claim 17, wherein said machine-readable instructions includes steps for:
 expanding an ORC marker by a constant expansion distance to form an expanded ORC marker;
 identifying a pair of side segments of said expanded ORC marker; and
 identifying a set of continuous line segments that is equidistant, within a resolution of a grid of said simulated lithographic pattern, from said pair of side segments within said expanded ORC marker, wherein said set of continuous line segments is a centerline for said expanded ORC marker.

20. The non-transitory machine-readable data storage device of claim 17, wherein said machine-readable instructions includes steps for identifying said set of ORC markers such that each end line portion of said set of ORC markers is located at a boundary at which a dimension of simulated lithographic pattern changes from below said minimum dimension to at least said minimum dimension.

* * * * *